US009183947B1

(12) United States Patent
Katoch

(10) Patent No.: US 9,183,947 B1
(45) Date of Patent: Nov. 10, 2015

(54) DETECTING WRITE DISTURB IN MULTI-PORT MEMORIES

(71) Applicant: TAIWAN SEMICONDUCTOR MANUFACTURING COMPANY, LTD., Hsinchu (TW)

(72) Inventor: Atul Katoch, Kanata (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/254,227

(22) Filed: Apr. 16, 2014

(51) Int. Cl.
*G11C 7/00* (2006.01)
*G11C 29/02* (2006.01)
*G11C 7/22* (2006.01)

(52) U.S. Cl.
CPC . *G11C 29/02* (2013.01); *G11C 7/22* (2013.01)

(58) Field of Classification Search
CPC ....... G11C 29/50; G11C 20/02; G11C 11/401
USPC ........................ 365/201, 230.05, 154, 233.11
See application file for complete search history.

(56) References Cited

U.S. PATENT DOCUMENTS 5,629,943 A * 5/1997 McClure ....................... 714/718

* cited by examiner

*Primary Examiner* — Son Dinh
(74) *Attorney, Agent, or Firm* — Hauptman Ham, LLP

(57) ABSTRACT

A circuit comprises a memory cell, a first circuit, and a second circuit. The memory cell has a first control line and a second control line. The first control line carries a first control signal. The second control line carries a second control signal. The first circuit is coupled with the first control line, the second control line, and a node. The second circuit is coupled to the node and is configured to receive a first clock signal and a second clock signal. The first circuit and the second circuit, based on the first control signal, the second control signal, the first clock signal and the second clock signal, are configured to generate a node signal on the node. A logical value of the node signal indicates a write disturb condition of the memory cell.

20 Claims, 4 Drawing Sheets

300
DRV_A
DRV_B
WL_A
WL_B
100i
320
310
N10_A
N10_B
VSS
330
P10_A
VDD
P10_B
VDD
CKP_A
CKP_B
DD
DDB
INV

DETECTING WRITE DISTURB IN MULTI-PORT MEMORIES

BACKGROUND

A multi-port memory cell provides independent data channels or ports that enable a read or a write operation on each port to addresses asynchronously from each other. For illustration, one port, such as a port P_A, is write accessed while the other port, such as a port P_B, is dummy read accessed. A dummy read refers to a situation in which the memory cell is not read accessed, but various signals cause the memory cell to be in a read-like condition and the data for reading is not reliable. Generally, the dummy read from port P_B increases a load on a storage node of the memory cell to be written, and thus prolongs the write time from port P_A. Stated differently, the write operation from port P_A is write disturbed by the dummy read from port P_B. In various approaches, the write disturb condition is detected based on circuitry that uses a match address of port P_A and port P_B.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
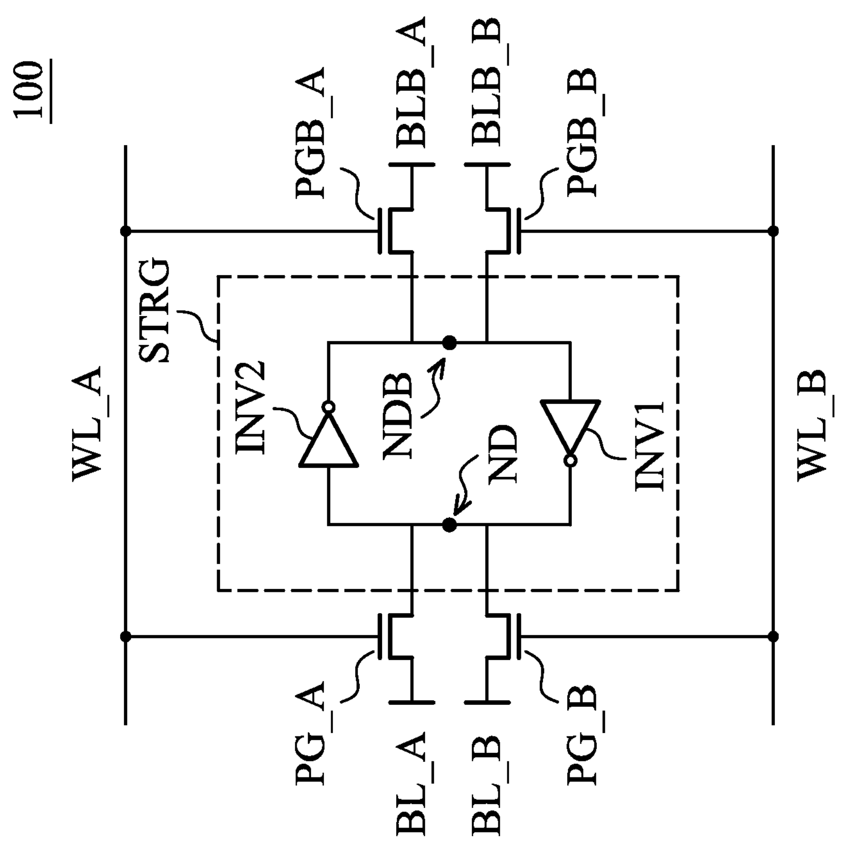
FIG. 1 is a diagram of a memory cell, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, a write disturb detect circuit is used to detect a write disturb condition based on word lines of corresponding memory cells. The word lines are outputs of word line drivers. Compared with other approaches, the write disturb detect circuit uses less space than the write disturb detect circuit used in other approaches. Further, the setup time for the clock signals that are used to generate the word lines in various embodiments of the present disclosure is also less than that of in other approaches.

Memory Cell

FIG. 1 is a diagram of a memory cell 100, in accordance with some embodiments. In various embodiments of the present disclosure, a write disturb condition of read-write ports of memory cell 100 is detected by circuit 310 in FIG. 3.

A storage area STRG includes two storage nodes ND and NDB to store data for memory cell 100. Node ND is at an output of an inverter INV1 and node NDB is at an output of an inverter INV2. Inverters INV1 and INV2 are cross-coupled. Node ND is associated with transistors or pass gates PG_A and PG_B, and node NDB is associated with pass gates PGB_A and PGB_B. By operation of memory cell 100, a logical value of node ND or node NDB is an inverse of one another.

A word line WL_A and a pair of pass gates PG_A and PGB_A form a first read-write port, which, for illustration, is called a port P_A (not labeled). A word line WL_B and a pair of pass gates PG_B and PGB_B form a second read-write port, which, for illustration, is called a port P_B (not labeled). When memory cell 100 is write accessed using the first port P_A, for example, data to be written to memory cell 100 is applied to bit lines BL_A and BLB_A at a drain of corresponding pass gates PG_A and PGB_A. Word line WL_A is then activated with a high logical value to turn on pass gates PG_A and PGB_A. As a result, the data on bit line BL_A is transferred through pass gate PG_A to node ND, and the data on bit line BLB_A is transferred through pass gate PGB_A to node NDB. For another example, when memory cell 100 is read accessed using the first port P_A, bit lines BL_A and BLB_A are charged to a high logical value. Word line WL_A is then activated with a high logical value to turn on pass gates PG_A and PGB_A. As a result, the data on node ND is transferred to bit line BL_A, and the data on node NDB is transferred to bit line BLB_A. The data on bit lines BL_A and BLB_A is then processed to reveal the data on corresponding nodes ND and NDB. Operations of port P_B are similar to those of port P_A.

In some embodiments, word lines WL_A and WL_B are each coupled to memory cells 100 in a row of a memory array. Further, bit lines BL_A and BLB_A are each coupled to memory cells 100 in a column of the memory array. Similarly, bit lines BL_B and BLB_B are each coupled to the memory cells 100 in the same column of bit lines BL_A and BLB_A. Word lines WL_A and WL_B are each also called a control line because word lines WL_A and WL_B control operations of corresponding pass gates PG_A, PGB_A, PG_B, and PGB_B. Bit lines BL_A, BLB_A, BL_B, and BLB_B are each also called a data line because bit lines BL_A, BLB_A, BL_B, and BLB_B each carry data for memory cell 100.

Memory cell 100 shown having two ports is for illustration. A memory cell 100 having more than two ports is within the contemplated scope of the present disclosure.

Memory Row, Disturb Illustration

Figure 2:
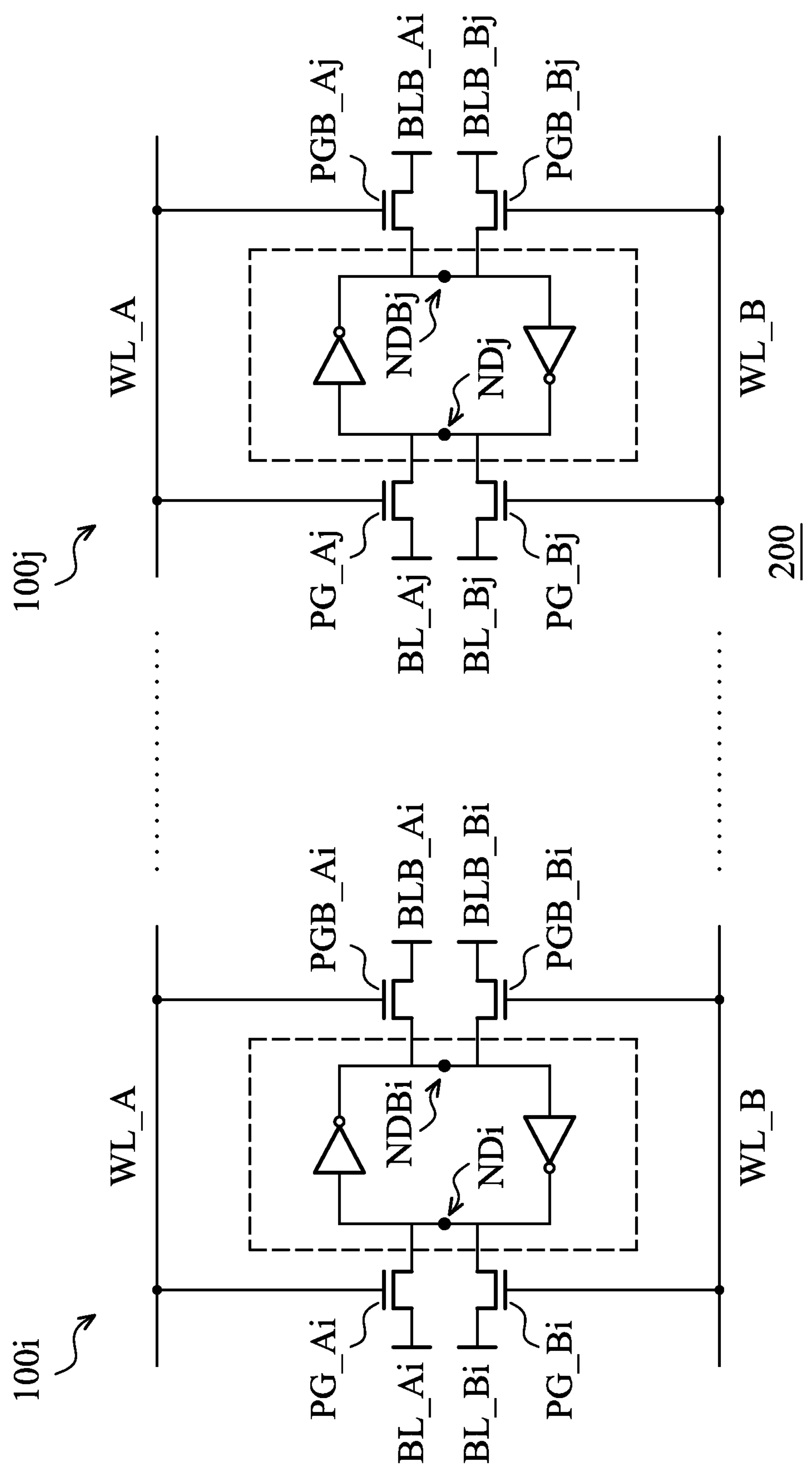
FIG. 2 is a diagram of a row of memory cells in FIG. 1, in accordance with some embodiments.

FIG. 2 is a diagram of a row 200 of a plurality of cells 100 in FIG. 1, in accordance with some embodiments. Row 200 is a row of a memory array (not shown). For illustration, two memory cells 100*i* and 100*j* are shown. Memory cells 100*i* and 100*j* are each also in a column (not shown) of the memory array.

Word line WL_A is associated with port P_A of cells 100*i* and 100*j*. Word line WL_B is associated with port P_B of cells 100*i* and 100*j*. For illustration, ports P_A and P_B of cell 100*i* are called ports P_Ai (not shown) and P_Bi (not shown), respectively, and ports P_A and P_B of cell 100*j* are called ports P_Aj (not shown) and P_Bj (not shown), respectively.

For further illustration, with reference to cell 100*i*, word line WL_A is activated with a high logical value to turn on pass gates PG_Ai and PGB_Ai for port P_Ai of to be write accessed. Additionally, with reference to cell 100*j*, word line WL_B is activated with a high logical value to turn on pass gates PG_Bj and PGB_Bj for port P_Bj to be read or write accessed. Because word line WL_B is activated, pass gates PG_Bi and PGB_Bi of cell 100*i* are also turned on, and port P_Bi of cell 100*i* is in a dummy read condition. Because port P_Bi is in a dummy read condition, port P_Bi causes a write disturb to port P_Ai.

Effectively, when port P_Ai is write accessed and port P_Bi is dummy read, port P_Ai is write disturbed by the dummy read of port P_Bi. Similarly, in various conditions, when port P_Bi is write accessed and port P_Ai is dummy read, port P_Bi is write disturbed by the dummy read of port P_Ai. With reference to memory cell 100*j*, in various conditions, port P_Aj or port P_Bj is write disturbed in a manner similar to that of port P_Ai or port P_Bi, respectively.

In various embodiments of the present disclosure, a write disturb condition could occur when two cells 100 are in a same row such as when cells 100*i* and 100*j* are in the same row 200. Further, in various embodiments, mechanisms are provided detect the disturb condition of ports P_Ai, P_Bi, P_Aj, or P_Bj.

Disturb Detect Circuitry

Figure 3:
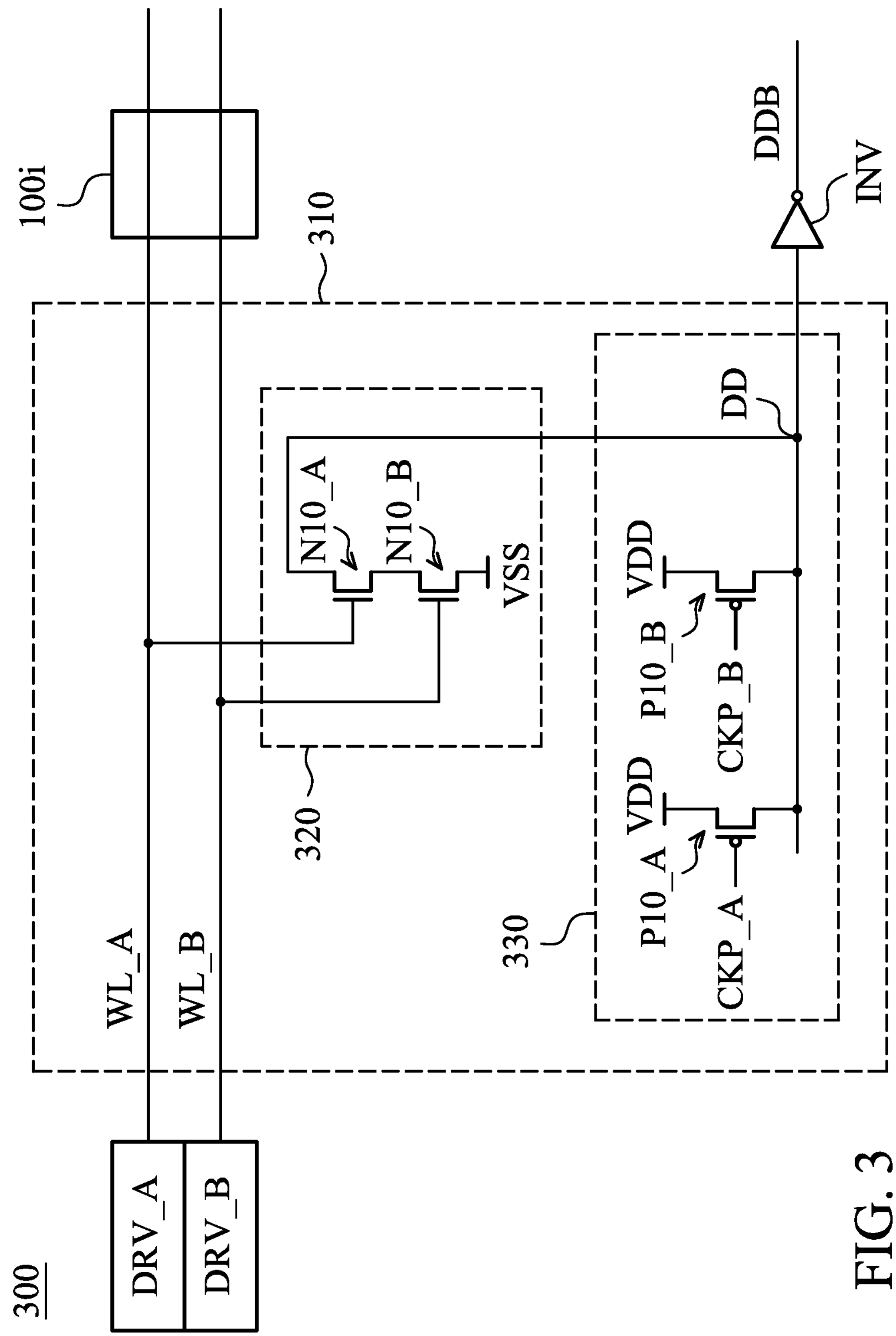
FIG. 3 is a diagram of a circuit used to detect a write disturb condition of a memory cell in FIG. 2, in accordance with some embodiments.

FIG. 3 is a diagram of a circuit 300, in accordance with some embodiments. For illustration, circuit 300 includes a disturb detect circuit 310 to detect a write disturb condition of port P_Ai or port P_Bi of cell 100*i*. Cell 100*i* is used for illustration, circuit 310 is applicable to other cells of row 200, including cell 100*j*, for example. Overall operations of circuit 300 are explained with reference to FIG. 4.

Figure 4:
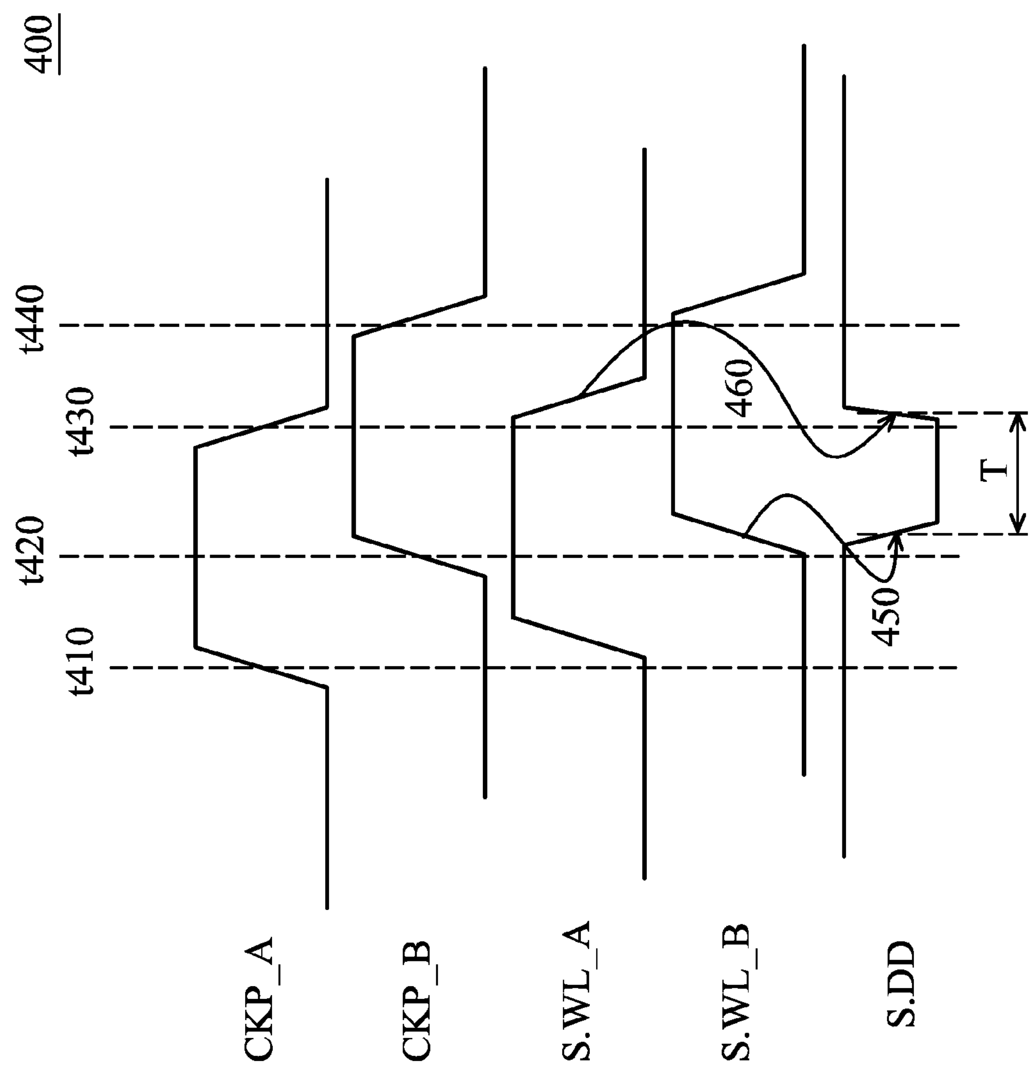
FIG. 4 is a graph of waveforms illustrating operations of the circuit in FIG. 3, in accordance with some embodiments.

Word line driver or driver DRV_A provides signal S.WL_A in FIG. 4 on word line WL_A. In some embodiments, word line driver DRV_A provides a high logical value to signal S.WL_A to activate word line WL_A, and provides a low logical value to signal S.WL_A to de-activate word line WL_A. In some embodiments, word line driver DRV_A generates signal S.WL_A based on clock signal CKP_A. For example, word line driver DRV_A generates a rising edge of signal S.WL_A based on a rising edge of clock signal CKP_A, and generates a falling edge of signal S.WL_A based on a falling edge of clock signal CKP_A. Effectively, a pulse width of signal S.WL_A corresponds to a pulse width of clock signal CKP_A. Various ways to generate signal S.WL_A based on clock signal CKP_A are within the contemplated scope of the present disclosure.

Word line driver DRV_B with reference to word line WL_B has architecture and functions similar to word line driver DRV_A with reference to word line WL_A. For example, word line driver DRV_B generates signal S.WL_B in FIG. 4 on word line WL_B in a manner similar to word line driver DRV_A generates signal S.WL_A. For another example, in some embodiments, word line driver DRV_B provides a high logical value to signal S.WL_B in FIG. 4 to activate word line WL_B, and provides a low logical value to signal S.WL_B to de-activate word line WL_B. Further, word line driver DRV_B generates a rising edge of signal S.WL_B based on a rising edge of clock signal CKP_B, and generates a falling edge of signal S.WL_B based on a falling edge of clock signal CKP_B. Effectively, a pulse width of signal S.WL_B corresponds to a pulse width of clock signal CKP_B.

Circuits 320 and 330 operate together to generate on node DD a signal S.DD in FIG. 4 that represents a write disturb condition of memory cell 100*i*. In some embodiments, signal S.DD is logically low when a write disturb occurs to port P_Ai due to a dummy read of port P_Bi, for example.

With reference to circuit 320, a gate of NMOS transistor N10_A is coupled to the output of driver DRV_A and write word line WL_A. A drain of transistor N10_A is coupled to node DD. A source of transistor N10_A is coupled to a drain of NMOS transistor N10_B. A gate of transistor N10_B is coupled to the output of driver DRV_B and write word line WL_B. A source of transistor N10_B receives reference supply voltage VSS, which, in some embodiments, is ground.

Transistors N10_A and N10_B function together to indicate that both word lines WL_A and WL_B are activated at the same time. For example, when signal S.WL_A is activated with a logical high value, the gate of transistor N10_A is logically high, and transistor N10_A is turned on. Similarly, when signal S.WL_B is activated with a high logical value, the gate of transistor N10_B is logically high, and transistor N10_B is turned on. In some embodiments, when at least one of word lines WL_A and WL_B is de-activated, node DD is logically high. When both word lines WL_A and WL_B are activated, both transistors N10_A and N10_B are turned on, and pull node DD at the drain of transistor N10_A to a low logical value at the source of transistor N10_B.

With reference to circuit 330, a source of PMOS transistor P10_A receives supply voltage VDD. A drain of transistor P10_A is coupled to node DD. Clock signal CKP_A at the gate of transistor P10_A turns on or off transistor P10_A. For example, when clock signal CKP_A is logical high, transistor P10_A is turned off. But when clock signal CKP_A is logically low, transistor P10_B is turned on.

A source of PMOS transistor P10_B also receives supply voltage VDD. A drain of transistor P10_B is also coupled with node DD. Clock signal CKP_B at the gate of PMOS transistor P10_B turns on or off transistor P10_B in a manner similar to clock signal CKP_A turning on or off transistor P10_A.

Transistor P10_A or P10_B functions to charge node DD. For example, when at least one of transistors P10A__ and P10_B is turned on, node DD is charged or pulled to a high logical value at the source of the then turned-on transistor. When both transistors P10_A and P10_B are turned off, node DD is floating, and is electrically affected by transistors N10_A and N10_B.

Inverter INV converts signal S.DD on node DD to provide a signal S.DDB (not shown) on node DDB, which, in some embodiments, is also used to indicate a write disturb condition based on the status of word line WL_A and WL_B. For example, in some embodiments, a positive pulse of signal S.DDB corresponds to a negative pulse of signal S.DD, and the width of the positive pulse of signal S.DDB indicates a time period of the write disturb condition.

In some embodiments, a memory array (not shown) includes a plurality of rows of memory cells, such as a plurality of rows 200 in FIG. 2. Further, each row of memory cells includes a corresponding group of circuitry that includes drivers DRV_A, DRV_B, word lines WL_A, WL_B and circuit 320. Each group of circuitry that includes drivers DRV_A, DRV_B, word lines WL_A, WL_B and circuit 320, together with circuit 330, functions to generate signal S.DD on node DD to indicate a disturb condition of a memory cell, such as memory cell 100*i*, in the corresponding row of memory cells, as illustrated in FIG. 4.

Waveforms

FIG. 4 is a graph of waveforms 400 illustrating operations of circuit 300 in FIG. 3, in accordance with some embodiments. In FIG. 4, the pulse width of signal S.WL_A of word line WL_A corresponds to the pulse width of signal CKP_A.

In some embodiments, a rising edge of signal CKP_A causes a rising edge of signal S.WL_A, and a falling edge of signal CKP_A causes a falling edge of signal S.WL_A. Similarly, the pulse width of signal S.WL_B of word line WL_B corresponds to the pulse width of signal CKP_B.

Further, the pulse width of signal S.DD of node DD is created and corresponds to a time period T in which both signals S.WL_A and S.WL_B are logically high and a disturb condition exists to either port P_Ai or port P_Bi of cell 100*i* in FIG. 2. Explained differently, signal S.DD is generated with a negative pulse when both word lines WL_A and WL_B are activated. Effectively, signal S.DD is logically low during time period T. As a result, signal S.DDB is logically high during time period T, but, for simplicity, signal S.DDB is not shown in FIG. 4.

For illustration, port P_Ai is write accessed to write to cell 100*i*, and port P_Bi is dummy read due to a read or write access by port P_Bj of cell 100*j*. As a result, port P_Ai is write disturbed by the dummy read of port P_Bi during time period T.

At time t410, signal CKP_A is activated, resulting in a rising edge of signal S.WL_A and transistor N10_A in FIG. 3 being turned on.

At time t420, signal CKP_B is activated, resulting in a rising edge of signal S.WL_B and transistor N10_B in FIG. 3 being turned on.

Because both transistors N10_A and N10_B are turned on, signal S.DD is pulled to a low logical value. Effectively, signal S.DD is pulled to the low logical value by the rising edge of signal S.WL_B, as illustrated by arrow 450.

At time t430, signal CKP_A is de-activated with a low logical value, resulting in the falling edge of signal S.WL_A and transistor N10_A being turned off. Because transistor N10_A is turned off, node DD is electrically disconnected from transistor N10_A. Because signal CKP_A is logically low, transistor P10_A is turned on and pulls signal S.DD to a high logical value of VDD at the source of transistor P10_A. Effectively, signal S.DD is pulled to a high logical value by the falling edge of signal S.WL_A, as illustrated by arrow 460.

At time t440, signal CKP_B is deactivated with a low logical value, resulting in the falling edge of signal S.WL_B and transistor N10_B being turned off. However, because transistor N10_A has been turned off, transistor N10_B being turned off has no electrical effect on node DD. Because signal CKP_B is logically low, transistor P10_B is turned on, and pulls signal S.DD to a high logical value of VDD at the source of transistor P10_B. As a result, both transistors P10_A and P10_B pull signal S.DD to the high logical value of supply voltage VDD.

Various embodiments of the present disclosure are advantageous over other approaches. For example, circuit 310 of the present disclosure having transistors N10_A, N10_B, P10_A, P10_B and inverter DDB is used to result in signal S.DD and S.DDB indicating when a write disturb condition exists. Circuit 310 uses a space less than a space used in other circuits in other approach to detect the same write disturb condition. Further, in some embodiments, a row address of memory cells corresponding to clock signal CKP_A is valid before the rising edge of clock signal CKP_A. The time when the row address being valid to the rising edge of clock signal CKP_A is called a setup time of clock signal CKP_A. In various embodiments of the present disclosure, the setup time of clock signal CKP_A is smaller than that of in other approaches.

In some embodiments, a circuit comprises a memory cell, a first circuit, and a second circuit. The memory cell has a first control line and a second control line. The first control line carries a first control signal. The second control line carries a second control signal. The first circuit is coupled with the first control line, the second control line, and a node. The second circuit is coupled to the node and is configured to receive a first clock signal and a second clock signal. A pulse width of the first control signal corresponds to a pulse width of the first clock signal. A pulse width of the second control signal corresponds to a pulse width of the second clock signal. The first circuit and the second circuit, based on the first control signal, the second control signal, the first clock signal and the second clock signal, are configured to generate a node signal on the node. A logical value of the node signal indicates a write disturb condition of the memory cell.

In some embodiments, a circuit comprises a memory cell, a first N-type transistor, a second N-type transistor, a first P-type transistor and a second P-type transistor. A gate of the first N-type transistor is configured to receive a first control signal. A drain of the first N-type transistor is coupled to a node. A source of the first N-type transistor is coupled to a drain of the second N-type transistor. A gate of the second N-type transistor is configured to receive a second control signal. A source of the second N-type transistor is configured to receive a voltage of a low logical value. A gate of the first P-type transistor is configured to receive a first clock signal. A source of the first P-type transistor is configured to receive a voltage of a high logical value. A drain of the first P-type transistor is coupled with the node. A gate of the second P-type transistor is configured to receive a second clock signal. A source of the second P-type transistor is configured to receive the voltage of the high logical value. A drain of the second P-type transistor is coupled with the node. A pulse width of the first control signal corresponds to a pulse width of the first clock signal. A pulse width of the second control signal corresponds to a pulse width of the second clock signal. A logical value of a signal on the node indicates a write disturb condition of the memory cell.

In some embodiments, a circuit comprises a plurality of rows of memory cells, a plurality of first circuits, and a second circuit. Each first circuit of the plurality of first circuits corresponds to each row of the plurality of rows, is coupled with a node, and is configured to receive a first control signal and a second control signal. The second circuit is coupled with the node, and is configured to receive a first clock signal and a second clock signal. A pulse width of the first clock signal corresponds to a pulse width of the first control signal of a row of the plurality of rows. A pulse width of the second clock signal corresponds to a pulse width of the second control signal of the row of the plurality of rows. The node is configured to have a logical value that represents a disturb condition of a memory cell of the row of the plurality of rows.

In a method of some embodiments, a first control line carries a first control signal. The first control line is coupled with memory cells of a row of a memory array. The second control line carries a second control signal. The second control line is coupled with the memory cells. In response to the first control signal and the second control signal being activated in a same time period, a disturb detect signal is generated to have a first logical value that represents a write disturb condition of a memory cell of the memory cells.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:

a memory cell having a first control line and a second control line, the first control line carrying a first control signal, the second control line carrying a second control signal;

a first circuit coupled with the first control line, the second control line, and a node; and a second circuit coupled to the node and configured to receive a first clock signal and a second clock signal, wherein a pulse width of the first control signal corresponds to a pulse width of the first clock signal;

a pulse width of the second control signal corresponds to a pulse width of the second clock signal;

the first circuit and the second circuit, based on the first control signal, the second control signal, the first clock signal and the second clock signal, are configured to generate a node signal on the node; and a logical value of the node signal indicates a write disturb condition of the memory cell.

2. The circuit of claim 1, wherein the first circuit includes a first N-type transistor and a second N-type transistor;

a gate of the first N-type transistor is configured to receive the first control signal;

a drain of the first N-type transistor is coupled with the node;

a source of the first N-type transistor is coupled with a drain of the second N-type transistor;

a gate of the second N-type transistor is configured to receive the second control signal; and a source of the second N-type transistor is configured to receive a supply voltage.

3. The circuit of claim 1, wherein the memory cell includes a first read-write port having the first control line as a first word line; and a second read-write port having the second control line as the second word line.

4. The circuit of claim 1, wherein the second circuit includes a first P-type transistor and a second P-type transistor;

a source of the first P-type transistor is configured to receive a supply voltage;

a gate of the first P-type transistor is configured to receive the first clock signal;

a drain of the first P-type transistor is coupled with the node;

a source of the second P-type transistor is configured to receive the supply voltage;

a gate of the second P-type transistor is configured to receive the second clock signal; and a drain of the second P-type transistor is coupled with the node.

5. The circuit of claim 1, further comprising an inverter having an input coupled with the node.

6. The circuit of claim 1, wherein:

the memory cell is a memory cell of a row of a memory array; and the first control line and the second control line are each coupled with other memory cells of the row of the memory array.

7. A circuit comprising:

a memory cell;

a first N-type transistor;

a second N-type transistor;

a first P-type transistor; and a second P-type transistor, wherein a gate of the first N-type transistor is configured to receive a first control signal;

a drain of the first N-type transistor is coupled to a node;

a source of the first N-type transistor is coupled to a drain of the second N-type transistor;

a gate of the second N-type transistor is configured to receive a second control signal;

a source of the second N-type transistor is configured to receive a voltage of a low logical value;

a gate of the first P-type transistor is configured to receive a first clock signal;

a source of the first P-type transistor is configured to receive a voltage of a high logical value;

a drain of the first P-type transistor is coupled with the node;

a gate of the second P-type transistor is configured to receive a second clock signal;

a source of the second P-type transistor is configured to receive the voltage of the high logical value;

a drain of the second P-type transistor is coupled with the node;

a pulse width of the first control signal corresponds to a pulse width of the first clock signal;

a pulse width of the second control signal corresponds to a pulse width of the second clock signal; and a logical value of a signal on the node indicates a write disturb condition of the memory cell.

8. The circuit of claim 7, wherein the memory cell includes a first read-write port having a first word line configured to carry the first control signal; and a second read-write port having a second word line configured to carry the second control signal.

9. The circuit of claim 7, further comprising an inverter having an input coupled with the node.

10. The circuit of claim 7, wherein the memory cell is a memory cell of a row of a memory array, the circuit further comprising:

a first control line coupled with the memory cell and other memory cells of the row of the memory array, and configured to carry the first control signal; and a second control line coupled with the memory cell and the other memory cells of the row of the memory array, and configured to carry the second control signal.

11. A circuit comprising:

a plurality of rows of memory cells;

a plurality of first circuits; and a second circuit, wherein each first circuit of the plurality of first circuits corresponds to each row of the plurality of rows, is coupled with a node, and is configured to receive a first control signal and a second control signal;

the second circuit is coupled with the node, and is configured to receive a first clock signal and a second clock signal;

a pulse width of the first clock signal corresponds to a pulse width of the first control signal of a first row of the plurality of rows;

a pulse width of the second clock signal corresponds to a pulse width of the second control signal of the first row of the plurality of rows; and the node is configured to have a logical value that represents a disturb condition of a memory cell of a row of the plurality of rows of memory cells.

12. The circuit of claim 11, wherein a first circuit of the plurality of first circuits includes a first N-type transistor and a second N-type transistor;

a gate of the first N-type transistor is configured to receive the first control signal;

a drain of the first N-type transistor is coupled with the node;

a source of the first N-type transistor is coupled with a drain of the second N-type transistor;

a gate of the second N-type transistor is configured to receive the second control signal; and a source of the second N-type transistor is configured to receive a supply voltage.

13. The circuit of claim 11, wherein each row of the plurality of rows includes a first control line configured to carry the first control signal; and a second control line configured to carry the second control signal.

14. The circuit of claim 11, wherein each row of the plurality of rows includes a first control line corresponding to a first port of memory cells in the each row of the plurality of rows; and a second control line corresponding to a second port of the memory cells in the each row of the plurality of rows.

15. The circuit of claim 11, wherein the second circuit includes a first P-type transistor and a second P-type transistor;

a source of the first P-type transistor is configured to receive a supply voltage;

a gate of the first P-type transistor is configured to receive the first clock signal;

a drain of the first P-type transistor is coupled with the node;

a source of the second P-type transistor is configured to receive the supply voltage;

a gate of the second P-type transistor is configured to receive the second clock signal; and a drain of the second P-type transistor is coupled with the node.

16. The circuit of claim 11, further comprising an inverter having an input coupled with the node.

17. A method comprising:

a first control line carrying a first control signal, the first control line coupled with memory cells of a row of a memory array;

a second control line carrying a second control signal, the second control line coupled with the memory cells of the row of the memory array; and in response to the first control signal and the second control signal being activated in a same time period, generating a disturb detect signal having a first logical value that represents a write disturb condition of a memory cell of the memory cells.

18. The method of claim 17, further comprising:

generating a pulse width of the first control signal based on a first clock signal; and generating a pulse width of the second control signal based on a second clock signal.

19. The method of claim 17, wherein the first control line is activated with a high logical value;

the second control line is activated with a high logical value; and the first logical value is a low logical value.

20. The method of claim 17, further comprising inverting the disturb detect signal.

* * * * *